(12) United States Patent
Utsunomiya et al.

(10) Patent No.: US 12,032,006 B2
(45) Date of Patent: Jul. 9, 2024

(54) BATTERY-LESS SENSOR CIRCUIT

(71) Applicant: ABLIC Inc., Tokyo (JP)

(72) Inventors: Fumiyasu Utsunomiya, Tokyo (JP); Takakuni Douseki, Kusatsu (JP); Ami Tanaka, Kusatsu (JP); Yasuhiro Hiraga, Kusatsu (JP); Shunta Furumura, Kusatsu (JP)

(73) Assignee: ABLIC INC., Tokyo (JP)

( * ) Notice: Subject to any disclaimer, the term of this patent is extended or adjusted under 35 U.S.C. 154(b) by 127 days.

(21) Appl. No.: 17/973,340

(22) Filed: Oct. 25, 2022

(65) Prior Publication Data

US 2023/0130291 A1   Apr. 27, 2023

(30) Foreign Application Priority Data

Oct. 26, 2021 (JP) ................. 2021-174588

(51) Int. Cl.
| | | |
|---|---|---|
| *G01R 19/165* | (2006.01) | |
| *G01R 19/00* | (2006.01) | |
| *H02J 7/00* | (2006.01) | |
| *H02J 7/34* | (2006.01) | |

(52) U.S. Cl.
CPC ..... *G01R 19/1659* (2013.01); *G01R 19/0084* (2013.01); *H02J 7/0063* (2013.01); *H02J 7/345* (2013.01)

(58) Field of Classification Search
CPC ............. G01R 19/1659; G01R 19/0084; H02J 7/0063; H02J 7/345; G01D 21/00
USPC ...................................... 324/111, 76.11, 658
See application file for complete search history.

(56) References Cited

U.S. PATENT DOCUMENTS

| | | | |
|---|---|---|---|
| 2018/0152100 A1 | 5/2018 | Utsunomiya et al. | |
| 2018/0331547 A1* | 11/2018 | Trochut | ................. G01D 21/00 |
| 2020/0243915 A1* | 7/2020 | Kuriyama | ........ G01R 19/16542 |
| 2021/0167612 A1* | 6/2021 | Lee | ......................... H02J 7/345 |

FOREIGN PATENT DOCUMENTS

JP    2018-085888 A    5/2018

* cited by examiner

*Primary Examiner* — Giovanni Astacio-Oquendo
(74) *Attorney, Agent, or Firm* — Crowell & Moring LLP

(57) ABSTRACT

Provided is a battery-less sensor circuit including a power generation element, a first switching element, a voltage control circuit, a first storage capacitor, a sensor circuit, and a load. The power generation element is connected to the first storage capacitor via the first switching element. A power supply terminal of the sensor circuit is connected to an input terminal of the first switching element. The voltage control circuit is configured to control a current passing through the first switching element through reception of a voltage of the input terminal of the first switching element. The load is connected to the first storage capacitor and the sensor circuit.

7 Claims, 1 Drawing Sheet

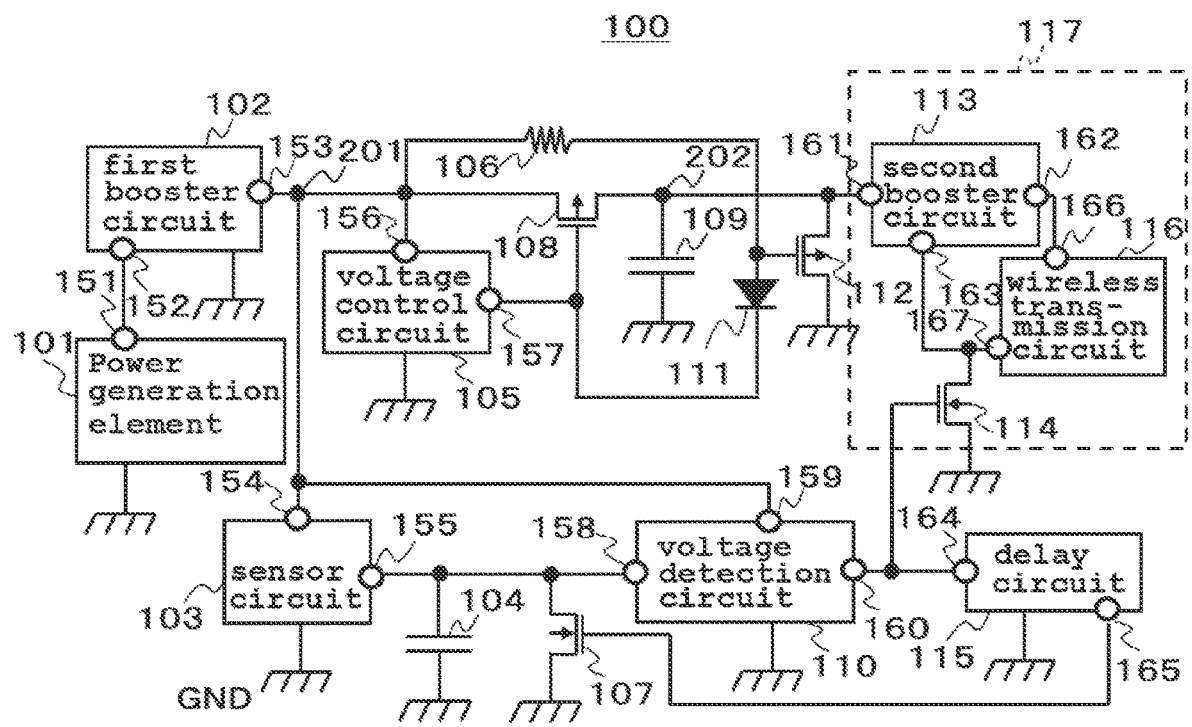

BATTERY-LESS SENSOR CIRCUIT

RELATED APPLICATIONS

This application claims priority to Japanese Patent Application No. 2021-174588, filed on Oct. 26, 2021, the entire content of which is incorporated herein by reference.

BACKGROUND OF THE INVENTION

1. Field of the Invention

The present invention relates to a battery-less sensor circuit.

2. Description of the Related Art

A related-art sensor circuit which operates without a battery includes no battery serving as a power supply. Thus, the related-art sensor circuit includes a power generation element, and operates through use of electric power generated by the power generation element. This power generation element is downsized due to needs of downsizing. Thus, the generated electric power is small, and thus a load for supplying results obtained through sensor measurement cannot directly be driven. In view of the above, the related-art battery-less sensor has a configuration in which the electric power generated by the power generation element is once stored in a storage capacitor, and after electric power corresponding to an amount capable of operating the load for a predetermined time period is stored in the storage capacitor, the load is operated for the predetermined time period through use of the electric power stored in the storage capacitor (for example, see FIG. 1 of Japanese Patent Application Laid-open No. 2018-085888).

The related-art battery-less sensor circuit stores the small electric power generated by the power generation element in the storage capacitor. Thus, until the electric power capable of operating the load for the predetermined time period is stored in the storage capacitor, the load cannot be operated. Accordingly, in sensing in a case in which a change in a sensing value of a sensor is large or a case in which the change frequently occurs, the sensing cannot be performed for a long period. Thus, there has been a problem in that a sensing accuracy is degraded.

SUMMARY OF THE INVENTION

The present invention has an object to provide a battery-less sensor circuit with which, in a case in which generated electric power is supplied from a power generation element, a storage capacitor can store the electric power while a sensor circuit and a voltage detection circuit are operated, and degradation of a sensing accuracy is consequently reduced.

According to at least one embodiment of the present invention, there is provided a battery-less sensor circuit including: a power generation element; a first switching element; a voltage control circuit; a first storage capacitor; a sensor circuit; and a load, wherein the power generation element is connected to the first storage capacitor via the first switching element, wherein a power supply terminal of the sensor circuit is connected to an input terminal of the first switching element, wherein the voltage control circuit is configured to control a current passing through the first switching element through reception of a voltage of the input terminal of the first switching element, and wherein the load is connected to the first storage capacitor and the sensor circuit.

With the above-mentioned configuration, the sensor accuracy of the battery-less sensor circuit can be improved.

BRIEF DESCRIPTION OF THE DRAWINGS

The attached FIGURE is a circuit diagram for illustrating an example of a battery-less sensor circuit according to a first embodiment of the present invention.

DETAILED DESCRIPTION OF THE PREFERRED EMBODIMENTS

First Embodiment

Now, description is given of a first embodiment of the present invention with reference to the drawing. FIG. 1 is a circuit diagram for illustrating an example of a battery-less sensor circuit 100 according to the first embodiment.

A configuration of the battery-less sensor circuit 100 according to the first embodiment is described. The battery-less sensor circuit 100 according to at least one embodiment of the present invention includes a power generation element 101, a first booster circuit 102, a sensor circuit 103, a voltage control circuit 105, a resistive element 106, a second storage capacitor 104, a first N-channel MOS transistor (hereinafter referred to as "NMOS transistor") 107 and a first P-channel MOS transistor (hereinafter referred to as "PMOS transistor") 108, a first storage capacitor 109, a voltage detection circuit 110, a diode 111, a second PMOS transistor 112, a second booster circuit 113, a second NMOS transistor 114, a delay circuit 115, and a wireless transmission circuit 116. The second booster circuit 113, the second NMOS transistor 114, and the wireless transmission circuit 116 form a load 117.

The power generation element 101 includes a power output terminal 151. The first booster circuit 102 includes a first input terminal 152 and a first output terminal 153. The sensor circuit 103 includes a first power supply terminal 154 and a sensor current output terminal 155. The voltage control circuit 105 includes a voltage monitor terminal 156 and a control terminal 157. The voltage detection circuit 110 includes a voltage detection terminal 158, a second power supply terminal 159, and a detection signal output terminal 160. The second booster circuit 113 includes a second input terminal 161, a second output terminal 162, and a third power supply terminal 163. The delay circuit 115 includes a detection signal input terminal 164 and a delay signal output terminal 165. The wireless transmission circuit 116 includes a fourth power supply terminal 166 and a fifth power supply terminal 167.

Connection of the battery-less sensor circuit 100 according to the first embodiment is described. The power output terminal 151 of the power generation element 101 is connected to the first input terminal 152 of the first booster circuit 102. The first output terminal 153 of the first booster circuit 102 is connected to a first node 201. The first power supply terminal 154 of the sensor circuit 103 is connected to the first node 201. The sensor current output terminal 155 of the sensor circuit 103 is connected to a first terminal of the second storage capacitor 104, a drain terminal of the first NMOS transistor 107, and the voltage detection terminal 158 of the voltage detection circuit 110. The voltage monitor terminal 156 of the voltage control circuit 105 is connected to the first node 201. The control terminal 157 of the voltage control circuit 105 is connected to a gate terminal of the first PMOS transistor 108 and a cathode terminal of the diode 111. A first terminal of the resistive element 106 is connected to the first node 201. A second terminal of the resistive element 106 is connected to an anode terminal of the diode 111 and a gate terminal of the second PMOS transistor 112.

A source terminal of the first PMOS transistor 108 is connected to the first node 201. A drain terminal of the first PMOS transistor 108 is connected to the first terminal of the first storage capacitor 109, a source terminal of the second PMOS transistor 112, and the second input terminal 161 of the second booster circuit 113 via a second node 202. The second output terminal 162 of the second booster circuit 113 is connected to the fourth power supply terminal 166 of the wireless transmission circuit 116. The third power supply terminal 163 of the second booster circuit 113 is connected to a source terminal of the second NMOS transistor 114 and the fifth power supply terminal 167 of the wireless transmission circuit 116. The second power supply terminal 159 of the voltage detection circuit 110 is connected to the first node 201. The detection signal output terminal 160 of the voltage detection circuit 110 is connected to a gate terminal of the second NMOS transistor 114 and the detection signal input terminal 164 of the delay circuit 115. The delay signal output terminal 165 of the delay circuit 115 is connected to a gate terminal of the first NMOS transistor 107. Description of connection to a GND terminal is omitted.

An operation of the battery-less sensor circuit 100 according to the first embodiment is described. Generated electric power supplied from the power output terminal 151 of the power generation element 101 enters the first input terminal 152 of the first booster circuit 102. The first booster circuit 102 converts the generated electric power having entered the first input terminal 152 into a first boosted power having a higher voltage, and supplies the first boosted power from the first output terminal 153 to the first node 201. The first boosted power supplied to the first node 201 is charged into the first storage capacitor 109 via the first PMOS transistor 108.

The voltage control circuit 105 operates through use of the first boosted power supplied from the first node 201 to the voltage monitor terminal 156. At the same time, the voltage control circuit 105 monitors the voltage of the first node 201 at the voltage monitor terminal 156, and supplies a control signal for controlling the gate of the first PMOS transistor 108 from the control terminal 157. In the manner described above, the voltage control circuit 105 controls the voltage of the first node 201 to a first predetermined voltage which is equal to or higher than a voltage capable of operating the sensor circuit 103 and the voltage detection circuit 110.

The first storage capacitor 109 is charged with the first boosted power via the first PMOS transistor 108. Until the voltage stored in the first storage capacitor 109 reaches the voltage of the first node 201, the first node 201 is controlled to have the first predetermined voltage by the first PMOS transistor 108. The second PMOS transistor 112 is turned off because a gate voltage of the second PMOS transistor 112 is higher than a gate voltage of the first PMOS transistor 108 due to the diode 111 and the resistive element 106.

In a case in which the voltage stored in the first storage capacitor 109 reaches the voltage of the first node 201, the first PMOS transistor 108 is completely turned on. The first PMOS transistor 108 connects the first node 201 and the second node 202 to each other. Thus, the first node 201 and the second node 202 are controlled to have the first predetermined voltage by the second PMOS transistor 112. In this case, the first PMOS transistor 108 operates as a switch for connecting the first node and the second node to each other.

The sensor circuit 103 operates through use of the first boosted power entering the first power supply terminal 154. The sensor circuit 103 supplies a sensor current corresponding to an environment measured by a sensor from the sensor current output terminal 155. The sensor current supplied from the sensor current output terminal 155 of the sensor circuit 103 is stored in the second storage capacitor 104. The voltage stored in the second storage capacitor 104 enters the voltage detection terminal 158 of the voltage detection circuit 110, and thus the voltage detection circuit 110 detects whether the voltage stored in the second storage capacitor 104 is equal to or higher than a second predetermined voltage. In a case in which the voltage detection circuit 110 detects that the voltage stored in the second storage capacitor 104, which enters the voltage detection terminal 158, is equal to or higher than the second predetermined voltage, the voltage detection circuit 110 supplies a detection signal from the detection signal output terminal 160. In a case in which the detection signal is supplied from the voltage detection circuit 110, the second NMOS transistor 114 is turned on.

In a case in which the second NMOS transistor 114 is turned on, the third power supply terminal of the second booster circuit 113 and the fifth power supply terminal of the wireless transmission circuit 116 are connected to the GND terminal, and the second booster circuit 113 and the wireless transmission circuit 116 are brought into an operable state. In a case in which the second booster circuit 113 is brought into the operable state, the second booster circuit 113 converts the electric power stored in the first storage capacitor 109, which enters the second input terminal 161, into a second boosted power having a higher voltage, and supplies the converted electric power from the second output terminal 162 as the second boosted power. In a case in which the wireless transmission circuit 116 is brought into the operable state, the wireless transmission circuit 116 operates through use of the second boosted power entering the fourth power supply terminal 166. The wireless transmission circuit 116 informs the outside that the second storage capacitor 104 has been charged to the second predetermined voltage due to the sensor current supplied from the sensor circuit 103.

In a case in which the wireless transmission circuit 116 operates, the electric power stored in the first storage capacitor 109 is consumed by the operation of the wireless transmission circuit 116. Thus, the voltage stored in the first storage capacitor 109 is reduced to around 0 V. However, in a case in which generated electric power of a predetermined amount or more is supplied from the power generation element 101, the first node 201 is controlled to have the first predetermined voltage by the voltage control circuit 105.

The delay circuit 115 supplies the detection signal entering the detection signal input terminal 164 from the delay signal output terminal 165 with a delay corresponding to a time required until the operation of the wireless transmission circuit 116 is completed. In a case in which the detection signal is supplied from the delay circuit 115, the first NMOS transistor 107 is turned on. Thus, the voltage stored in the second storage capacitor 104 is reduced to around 0 V.

In a case in which the voltage detection circuit 110 detects that the voltage stored in the second storage capacitor 104 entering the voltage detection terminal 158 is lower than the second predetermined voltage, the voltage detection circuit 110 supplies a detection cancellation signal from the detection signal output terminal 160. In a case in which the detection cancellation signal is supplied from the voltage detection circuit 110, the second NMOS transistor 114 is turned off. Thus, the second booster circuit 113 and the wireless transmission circuit 116 are disconnected from the GND terminal, and are brought into an operation stop state.

In a case in which the second booster circuit 113 and the wireless transmission circuit 116 are brought into the operation stop state, the power storage of the first storage capacitor 109 is restarted. The delay circuit 115 supplies the detection cancellation signal entering the detection signal input terminal 164 from the delay signal output terminal 165 with a delay corresponding to a time required for the voltage stored in the second storage capacitor 104 to be reduced to around 0 V. In a case in which the detection cancellation signal is supplied from the delay circuit 115, the first NMOS transistor 107 is turned off. Thus, the power storage of the second storage capacitor 104 is restarted.

Setting of a capacitance value of the first storage capacitor 109 and a capacitance value of the second storage capacitor 104 is described. The first storage capacitor 109 is charged with the electric power generated by the power generation element 101. The capacitance value of the first storage capacitor 109 is set to be equal to or larger than a capacitance value capable of operating the wireless transmission circuit 116 for a predetermined time period through use of the electric power stored in the first storage capacitor 109 at the time at which the voltage stored in the first storage capacitor 109 has become the first predetermined voltage as a result of progress of charging of the first storage capacitor 109. The second storage capacitor 104 is charged with the sensor current supplied from the sensor circuit 103. The capacitance value of the second storage capacitor 104 is set to be equal to or larger than such a capacitance value that, in a case in which a first time period required until electric power to be stored to allow the wireless transmission circuit 116 to be operated for a predetermined time period can be stored in the first storage capacitor 109 which has restarted the power storage and a second time period required until the voltage stored in the second storage capacitor 104 reaches the second predetermined voltage detected by the voltage detection circuit 110 are compared with each other, the second time period is always longer. Through setting of the capacitance values as described above, the wireless transmission circuit 116 can operate for the predetermined time period through use of the electric power stored in the first storage capacitor at the time at which the voltage stored in the second storage capacitor has reached the second predetermined voltage.

In the configuration of the battery-less sensor according to the at least one embodiment of the present invention, for example, in a case in which a battery-less ultraviolet (UV) accumulation amount sensor is to be achieved, it is preferred that the power generation element 101 be a one-cell solar battery. It is preferred that the first booster circuit 102 be a charge pump booster circuit. It is preferred that the sensor circuit 103 have a configuration in which a sensor current corresponding to an amount of received ultraviolet rays is supplied. A configuration utilizing power generation through use of ultraviolet rays is preferred because less current is consumed. It is preferred that the second booster circuit 113 be a booster circuit using a coil. It is preferred that the wireless transmission circuit 116 have a configuration having a function of supplying a wireless signal. In a case in which a voltage of generated electric power supplied from the power generation element 101 is sufficiently high, the generated electric power may enter the first node 201 without passing through the first booster circuit 102. In a case in which the electric power stored in the first storage capacitor 109 is sufficiently large, the electric power stored in the first storage capacitor 109 may enter the fourth power supply terminal 166 of the wireless transmission circuit 116 without passing through the second booster circuit 113. Each of the first PMOS transistor 108, the second PMOS transistor 112, the first NMOS transistor 107, and the second NMOS transistor 114 operates as a switching element capable of controlling an ON resistance by a control signal.

According to the battery-less sensor of the at least one embodiment of the present invention, in a case in which the generated electric power is supplied from the power generation element, the first storage capacitor can store the electric power while the sensor circuit and the voltage detection circuit are operated. Thus, the degradation of the sensing accuracy, which has been a problem in the related art, can be reduced.

Further, there is employed a configuration in which a time period required for the second storage capacitor charged with the sensor current supplied from the sensor circuit to be charged to the second predetermined voltage is supplied as a sensing result. Thus, as compared to the related-art sensing method of detecting the sensor current at predetermined time intervals and storing the sensor current, not only improvement of the detection accuracy but also reduction of electric power to be consumed for sensing can be achieved. Consequently, even with a power generation element which is downsized and is thus reduced in electric power to be generated, the sensing can be performed through use of the electric power generated by the power generation element.

Further, the voltage of the detection signal for bringing the second booster circuit and the load into the operable state is not reduced together with the reduction of the voltage of the first storage capacitor. Thus, even in a case in which the voltage of the first storage capacitor reduces, the detection signal can maintain the operable state of the second booster circuit and the load.

What is claimed is:

1. A battery-less sensor circuit, comprising:
   a power generation element;
   a first switching element;
   a voltage control circuit;
   a first storage capacitor;
   a sensor circuit; and
   a load,
   wherein the power generation element is connected to the first storage capacitor via the first switching element,
   wherein a power supply terminal of the sensor circuit is connected to an input terminal of the first switching element,
   wherein the voltage control circuit is configured to control a current passing through the first switching element through reception of a voltage of the input terminal of the first switching element, and
   wherein the load is connected to the first storage capacitor and the sensor circuit.

2. The battery-less sensor circuit according to claim 1, further comprising a second storage capacitor and a voltage detection circuit,
   wherein the second storage capacitor is connected to the sensor circuit, and
   wherein the voltage detection circuit is configured to control the load through reception of a voltage stored in the second storage capacitor.

3. The battery-less sensor circuit according to claim 2, wherein a capacitance value of the second storage capacitor is set to such a capacitance value that, as compared to a time period required for the first storage capacitor to be charged to a first predetermined voltage through output of the power generation element, a time period required for the second storage capacitor to be charged to a second predetermined voltage through output of the sensor circuit becomes longer.

4. The battery-less sensor circuit according to claim 2, wherein the voltage detection circuit is to be driven by input electric power of the first switching element.

5. The battery-less sensor circuit according to claim 2, further comprising:
   a delay circuit configured to supply an output signal of the voltage detection circuit with a delay of a predetermined time period; and
   a second switching element to be controlled by a signal supplied from the delay circuit,
   wherein the second switching element is used to discharge the second storage capacitor.

6. The battery-less sensor circuit according to claim 1, further comprising a first booster circuit arranged between the power generation element and the first switching element.

7. The battery-less sensor circuit according to claim 1, wherein the load includes a second booster circuit connected to the first storage capacitor.

\* \* \* \* \*